EXTREME LOW NOISE TRANSISTOR AMPLIFIERS

Original Filed April 13, 1961 2 Sheets-Sheet 1

INVENTOR
FRANK SCHWARZ
BY Robert Ames Norton
ATTORNEY

June 28, 1966 F. SCHWARZ 3,258,705

EXTREME LOW NOISE TRANSISTOR AMPLIFIERS

Original Filed April 13, 1961 2 Sheets-Sheet 2

INVENTOR
FRANK SCHWARZ
BY Robert Ames Norton
ATTORNEY

United States Patent Office 3,258,705
Patented June 28, 1966

3,258,705
EXTREME LOW NOISE TRANSISTOR AMPLIFIERS
Frank Schwarz, Stamford, Conn., assignor to Barnes Engineering Company, Stamford, Conn., a corporation of Delaware
Continuation of application Ser. No. 102,785, Apr. 13, 1961. This application Mar. 18, 1965, Ser. No. 440,703
8 Claims. (Cl. 330—25)

This application is a continuation of an earlier application Serial No. 102,785 filed April 13, 1961, and now abandoned. This invention relates to low noise transistor amplifiers and more particularly to such amplifiers in which the signal to noise ratio remains high.

Transistors are primarily current amplifying devices and it has been considered in the past that for stable operation and good signal-to-noise ratio there should be an adequate steady state collector and emitter current. It is common practice to employ currents in small signal transistors from .5 to 1 ma. Occasionally amplifiers have been built with steady state collector currents with the order of 100 μa. but anything much below this minimum figure has been considered a freak.

The biggest problem in many transistorized amplifiers is the so-called $1/f$ noise, that is a noise which increases rapidly as the frequency drops. This noise has been particularly serious in many instruments requiring maximum sensitivity of which infrared instruments using thermistor bolometers are a typical example. The present invention is in no sense limited thereto and the low noise amplifiers which it makes possible may be used for any purposes where this characteristic is vital. The problems of noise reduction and a practical example of an amplifier will be described in conjunction with the amplification of a signal from a thermistor bolometer because this brings out so typically the problems presented and the advantages of the solutions represented by the present invention.

A type of transistor amplifier has been described, the so-called "hushed" transistor amplifier. In these amplifiers extremely low junction potentials and particularly potentials across the base collector junction of the transistors has been used. These junction potentials have been dropped but to little above zero volts. Some improvements were shown in noise but the curves of such amplifiers indicated optimum operation with quite respectable currents, 500 μa. or more for optimum results. While the overall noise of the hushed transistor amplifier was very much better than the ordinary amplifiers operating with sizable junction potentials, there were serious limits. Thus, for example, $1/f$ noise began to increase quite sharply at frequencies around 500 c.p.s. or less and therefore the hushed amplifiers, just as ordinary transistorized amplifiers, gave much better results at moderately elevated frequencies.

According to the present invention when transistor amplifiers are designed with certain parameters extraordinary improvement in $1/f$ noise is obtained with good signal to noise ratios. The most important single parameter is a very low collector current which must be below 70 μa. and peferably below 10 μa. Typical optimum results are obtained from 1 to 5 μa. While the junction potentials should be low, they need not be as low as in the high current hushed transistor amplifiers where at times even reverse bias is used. Junction potentials up to a volt or slightly more may be used although for the very lowest possible noise these potentials should be kept below .5 volt.

Another parameter of the present invention is the resistance or impedance of the source, the signals from which are to amplified. For optimum results under a wide variety of operating conditions the optimum source resistance is shown in the text book "Transistor Electronics" by De Witt and Rossoff. The equation numbered (16–33) appears on page 350 as follows:

$$R_{gg}{}^2 = r_b{}^2 + \frac{r_b + r_e/2}{(q/2kT)(\Delta I_c + I_{co})}$$

Under the new operating conditions of the present invention, that is, low voltage and very low current, the quantities $I_{co}$ is collector leakage current, and $r_e$ which is the intrinsic emitter resistance become so low that they can be neglected. This is particularly true since, as will be pointed out below, there is a considerable range of source resistance over which the improved results of the present invention are obtained. When these quantities are neglected, the simplified equation takes the following form:

$$R_s{}^2(\text{opt}) = \frac{2kTr_b\beta + r_b{}^2 qI_c}{qI_c}$$

$R_s$ taking the place of $R_{gg}$ and $\Delta$ being written in the more customary form as $$1/\beta$$

The symbol $r_b$ is the intrinsic base resistance of the first transistor under the operating conditions chosen without considering feedback, and $k$ and $q$ have their usual significance as designating the Stefan Boltzmann constant and the charge of an electron respectively, and T has its usual significance of absolute temperature in degrees Kelvin. The quantities are used in the specification and claims in this meaning only.

In the simplified equation $I_c$, T and $r_b$ are not independent variables but are interrelated. Within the limits of $I_c$ there is a fair amount of flexibility in choosing $R_s$. Considerable departure from the optimum $R_s$ is possible. Departure by a factor of 3 either way will result in degradations of performance of not more than about 20%.

Feedback is used to permit a stable amplifier with a relatively very large bias resistance for the base of the first transistor. It will be shown below that for optimum results this base bias resistance should be considerably higher than the source resistance. Without adequate negative feedback a high base bias resistor would result in an unstable amplifier. Therefore, while the impedance itself does not change the noise figure, it permits changing another parameter to produce this desired effect.

An important relationship is that of input impedance of the first transistor to source resistance. This input impedance should be at least twice as high as source resistance and preferably 5 to 20 times. It will be shown below that there is no advantage in greatly exceeding a ratio of 20 times and too great a mismatch results in undesired signal attenuation. While a larger input impedance than $R_s$ is an essential feature of the present invention, the exact value of this ratio is not at all critical.

In order to have reasonable current amplification it is necessary to use modern transistors which have a fairly high $\beta$ even at low collector currents; otherwise there will not be sufficient amplification in the first stage of the amplifier. When transistors having a satisfactory $\beta$ at low currents are used, it will ordinarily be sufficient to use the extremely low currents only in the first stage of the amplifier and this presents practical advantages. However, if the amplification in the first stage is not sufficient there may still be the risk of considerable development of noise in the second stage and in such a case the second transistor also should be operated under the conditions of the present invention. Once an adequate signal level has been obtained the rest of the amplifier follows standard practice, bearing in mind, of course, that we are dealing with uses which require a very low noise and so the whole of the amplifier should follow good transistor amplifier design practice. However, it is an advantage that most of the amplifier does not require any critical control of collector currents and even in the first stage or where necessary the first two stages, where the present invention is involved the low current is not critical. In other words, it is not necessary that the current be exactly 2 or 4 or 5 $\mu$a. and slight variations during operation will not result in excessive noise. This is not to say that care should not be taken in choosing stable transistors and in general the care which any precision low noise amplifier requires should be employed.

In the past it has been noted that pnp transistors are somewhat quieter than npn. This is true in the present invention also, but the quieting effected is so great that in some instances it is possible to use npn transistors which would be far too noisey in the first stage of amplifiers as ordinarily built. In general there is a wide choice of modern transistors both of germanium and silicon. Typical ones are 2N1010, 2N422, 2N1443, 2N1026, 2N1027, 2N329A, 2N3304, 2N1247, 2N1248 and L6121. The other operating conditions of the amplifier such as temperature of operation also are a factor in the choice of the transistor. For example, at higher temperatures silicon transistors are preferable to germanium transistors. On the other hand it is easier to produce npn transistors of silicon than pnp and it will be noted that some of these have been listed above. This is an important advantage of the present invention as the quieting is so great that npn transistors can be used, thus making the choice for high temperature work much greater than it otherwise would have been.

The invention will be described in greater detail in conjunction with the drawings in which.

Figure 1:
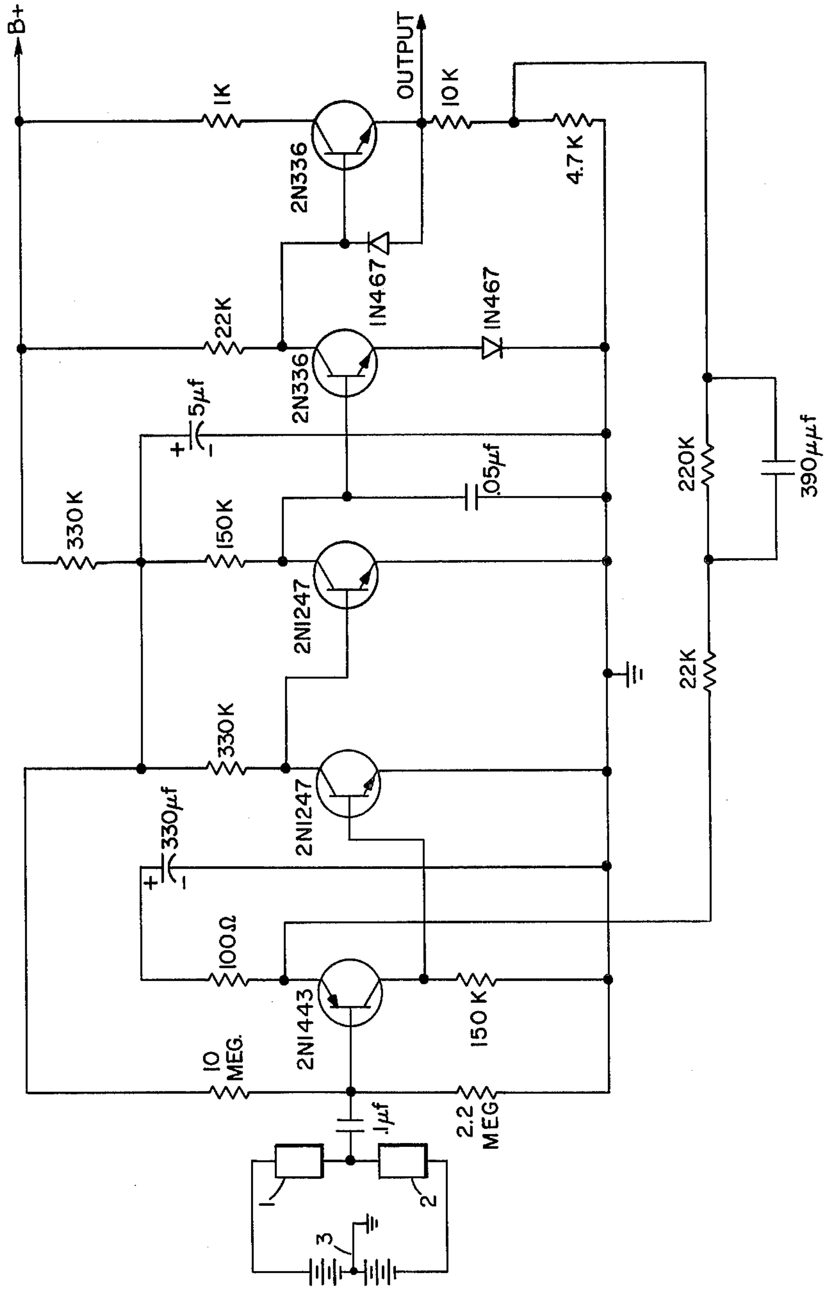
FIG. 1 is a schematic of a typical amplifier.

In FIG. 1 the amplifier is shown as a preamplifier for the signal from a conventional thermistor bolometer shown with an active flake 1 and a passive flake 2 and the customary bias supply 3. The bolometer resistance is 100K. It will be seen the negative feedback provided permits the use as base bias resistance of a parallel combination of 10 meg. and 2.2 meg. group, an input impedance of 1.8 meg. The first two stages are operated with typical low noise silicon transistors useful in the present invention. The first transistor of 2N1443 is operated at 4 $\mu$a. emitter current, the second transistor a silicon 2N1247 is also operated at low current of 20 $\mu$a. though not quite as low as the first transistor. From then on the transistors are operated at more normal currents from 5 ma. up. The amplifier is straightforward in nature and is well stabilized by the negative feedback.

The first transistor, the 2N1443, receives feedback from the output of the amplifier. About 31% of the output is feedback in two forms, a D.C. feedback path through the 220K and 22K resistors to the emitter of the first transistor and thence through the transistor and the collector load resistor 150K. A.C. feedback is also provided. Here the feedback differs very greatly with frequency. At between about 4 and 5 cycles the 330 $\mu$f. capacitor 4 has an impedance that is comparable to that of the emitter resistor and so for all practical purposes the A.C. feedback is determined by the value of the 220K and 22K resistors referred to above and the impedance of the first transistor with its collector load resistor. At about 1800 cycles the impedance of the above capacitor becomes negligible and there is provided a shunt path to ground of about 100 ohms. At this frequency the impedance of the 390 mmf. capacitor 5 which shunts the 220K feedback resistor decreases to a point where it is comparable in value. As a result at these two extreme frequencies the gain of the first transistor is down about 3 db. At about the mid frequency where the D.C. feedback and A.C. feedback are approximately equal the current flow through the first transistor is about 4 $\mu$a. This corresponds to the bottom curve on FIG. 3 which will be described below. The amount of negative feedback completely stabilizes the amplifier.

The collector-emitter potential of the first transistor is approximately .5 volt, the collector-base junction voltage being considerably lower. The rest of the transistors are operated at somewhat higher currents and as the total noise is effectively limited by the noise developed in the bolometer it is not necessary to go to extremes in low collector currents.

Figure 2:
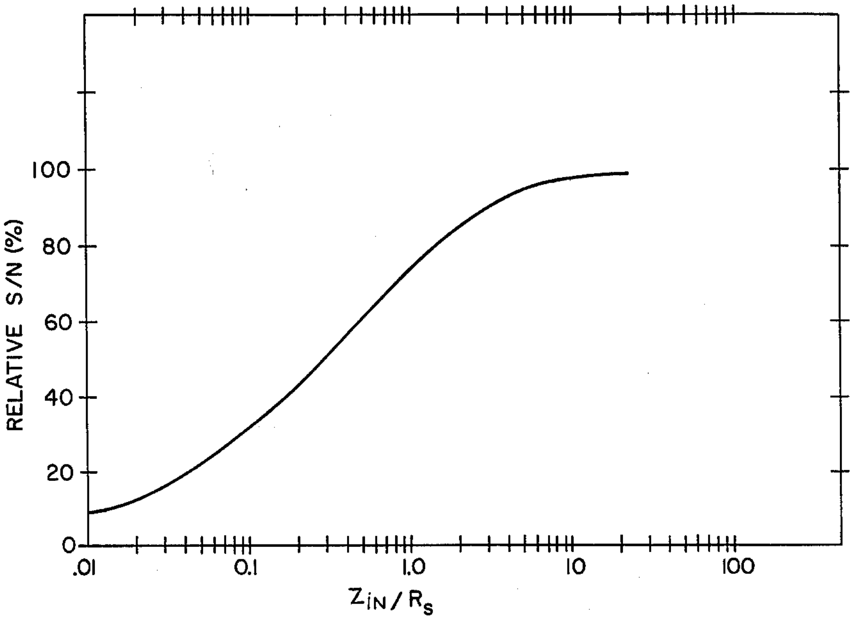
FIG. 2 is a curve showing noise reduction with mismatch of source resistance and amplifier input impedance.

FIG. 2 illustrates the signal-to-noise ratio with varying relative amounts of source resistance and amplifier input impedance. In FIG. 1 it will be seen that the net input impedance is determined by two parallel impedances, one the base bias resistors and the other the impedance through the transistor. In FIG. 1 the value of the two base bias resistors, which for A.C. are substantially in parallel, is approximately 1.8 meg. This is in parallel with the circuit through the transistor the impedance of which is much higher so that the net input impedance of the amplifier approximates 1.5 meg. It will be seen that when this ratio has reached five the signal-to-noise ratio is approximately at an optimum and does not change significantly between a ratio of 5 and a ratio of 20, i.e., between about 300K and 75K.

Figure 3:
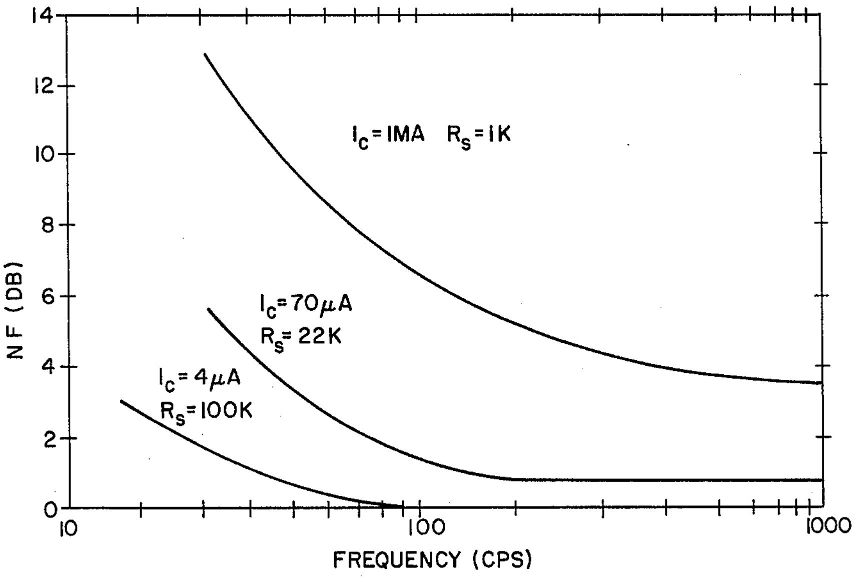
FIG. 3 is a series of curves showing noise at different currents and different frequencies.

FIG. 3 illustrates test curves for noise of the first stage of the amplifier of FIG. 1 using different collector currents the source resistance in each case being changed to an optimum.

It will be seen that with this transistor there is almost no noise from 100 cycles up and even at 20 cycles with a 4 $\mu$a. current the noise is only about 1db. The $1/f$ noise is seen to increase as the current is increased and reaches a much higher value, 12 db. with 1 ma. current. Another important feature is the slope of the curve at 20 c.p.s. It will be seen that at the really low currents which are representative of the preferred practice of the present invention, the slope is quite flat and the rate at which it increases very moderate so that even at still lower frequencies good operation is possible. This results in pushing the field of utility in low frequency amplication far beyond anything which was possible before. It is in this low frequency amplification region that the need for reduction of noise in the amplifiers is really serious. At high frequencies even ordinary transistor amplifiers can be used without excessive noise.

I claim:

1. A low noise transistor amplifier system comprising in combination a non-amplifying signal source and at least one transistor amplifier stage having an input and an output and first stage elements and means connecting the signal source to the base of the first transistor and a feedback path from the output to the input of said first stage of the amplifier, the optimum signal source resistance being defined as follows:

$$R_s^2\ (\text{opt}) = \frac{2kTr_b\beta + r_b^2 qI_c}{qI_c}$$

where T is the absolute temperature, $k$ is the Stefan Boltzmann constant, $q$ is the charge on an electron, $I_c$ is collector current with feedback, $\beta$ is the current amplification of the first transistor and $r_b$ is the intrinsic base resistance of the first transistor under the operating conditions chosen without considering feedback, wherein, (a) the resistance of the signal source being from one third to three times the optimum defined above, (b) base biasing means which, in combination with the feedback components and elements of the first stage of the amplifier, produces an $I_c$ not exceeding 70 $\mu$a., (c) the input impedance of the first transistor amplifier stage being greater than the signal source resistance, and (d) $\beta$ cutoff being substantially lower than the operating $I_c$.

2. An amplifier system according to claim 1 in which the collector current of the first stage transistor does not substantially exceed 10 $\mu$a.

3. An amplifier system according to claim 1 in which the transistor is of the pnp type.

4. A transistor amplifier according to claim 1 in which the transistor is a silicon transistor.

5. A low noise transistor amplifier system according to claim 1 in which the input impedance is 5 to 20 times source resistance.

6. An amplifier according to claim 5 in which the $I_c$ of the first stage transistor does not substantially exceed 10 $\mu$a.

7. An amplifier system according to claim 6 in which the transistor is of the pnp type.

8. A transistor amplifier according to claim 6 in which the transistor is a silicon transistor.

References Cited by the Examiner

UNITED STATES PATENTS

| | | | |
|---|---|---|---|
| 2,852,625 | 9/1958 | Nuut | 330—19 X |
| 2,885,494 | 5/1959 | Darlington et al. | 330—19 |
| 3,034,067 | 5/1962 | Poorter | 330—25 |

OTHER REFERENCES

Dewitt and Rossoff: "Transistor Electronics," 1957, McGraw-Hill Co., TK7872.T73.D4, chapt. 16, pages 342, 349–351 relied on in particular.

NATHAN KAUFMAN, *Primary Examiner.*

ROY LAKE, *Examiner.*

F. D. PARIS, *Assistant Examiner.*